US012719482B2

(12) United States Patent
Song et al.

(10) Patent No.: US 12,719,482 B2
(45) Date of Patent: Aug. 25, 2026

(54) DOUBLY-BALANCED AUTO-ZERO LFPS AND SQUELCH DETECTION

(71) Applicant: Intel Corporation, Santa Clara, CA (US)

(72) Inventors: Hongjiang Song, Mesa, AZ (US); Mingming Xu, Phoenix, AZ (US); Vijayalakshmi Ramachandran, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 155 days.

(21) Appl. No.: 17/864,593

(22) Filed: Jul. 14, 2022

(65) Prior Publication Data

US 2024/0022254 A1 Jan. 18, 2024

(51) Int. Cl.

*H03L 7/093* (2006.01)
*H03K 19/20* (2006.01)
*H03L 7/091* (2006.01)
*H03L 7/107* (2006.01)

(52) U.S. Cl.

CPC ............. *H03L 7/093* (2013.01); *H03K 19/20* (2013.01); *H03L 7/091* (2013.01); *H03L 7/107* (2013.01)

(58) Field of Classification Search

CPC .. H03K 5/01; H03K 5/08; H03K 5/02; H03K 5/023; H03K 5/082; H03K 5/084

See application file for complete search history.

(56) References Cited

U.S. PATENT DOCUMENTS 7,715,262 B2 * 5/2010 Afghahi ............... G11C 29/026 365/207
10,560,070 B2 * 2/2020 Gramegna ......... H03H 11/1291

* cited by examiner

*Primary Examiner* — Diana J. Cheng
(74) *Attorney, Agent, or Firm* — NICHOLSON DE VOS WEBSTER & ELLIOTT LLP

(57) ABSTRACT

An apparatus, system, and method for low frequency periodic signaling (LFPS) and/or squelch detection are provided. A circuit can include a threshold generator situated to receive a differential input signal from an initiator device and generate a differential voltage threshold signal based on the differential input signal, an amplifier circuit electrically coupled to the threshold generator situated to amplify the differential voltage threshold signal resulting in an amplified threshold signal, a sampler situated to sample the amplified threshold signal at a first clock rate faster than a clock rate of an LFPS/squelch signaling frequency resulting in digital sample results, and a pattern filter circuit situated to determine if the digital sample results are asserted for each of a specified number of consecutive clock cycles at the first clock rate.

20 Claims, 6 Drawing Sheets

RECEIVE, BY A THRESHOLD GENERATOR, A DIFFERENTIAL INPUT SIGNAL FROM AN INITIATOR DEVICE — 660

GENERATE, BY THE THRESHOLD GENERATOR, A DIFFERENTIAL VOLTAGE THRESHOLD SIGNAL BASED ON THE DIFFERENTIAL INPUT SIGNAL — 662

AMPLIFY, BY AN AMPLIFIER CIRCUIT ELECTRICALLY COUPLED TO THE THRESHOLD GENERATOR, THE DIFFERENTIAL VOLTAGE THRESHOLD SIGNAL RESULTING IN AN AMPLIFIED THRESHOLD SIGNAL — 664

SAMPLE, BY A SAMPLER, THE AMPLIFIED THRESHOLD SIGNAL AT A FIRST CLOCK RATE FASTER THAN A CLOCK RATE OF AN LFPS/ SQUELCH SIGNALING FREQUENCY RESULTING IN DIGITAL SAMPLE RESULTS — 666

GENERATE, BY A PATTERN FILTER CIRCUIT, AN OUTPUT SIGNAL INDICATING THAT DIGITAL SAMPLE RESULTS WERE ASSERTED FOR EACH OF A SPECIFIED NUMBER OF CONSECUTIVE CLOCK CYCLES AT THE FIRST CLOCK RATE — 668

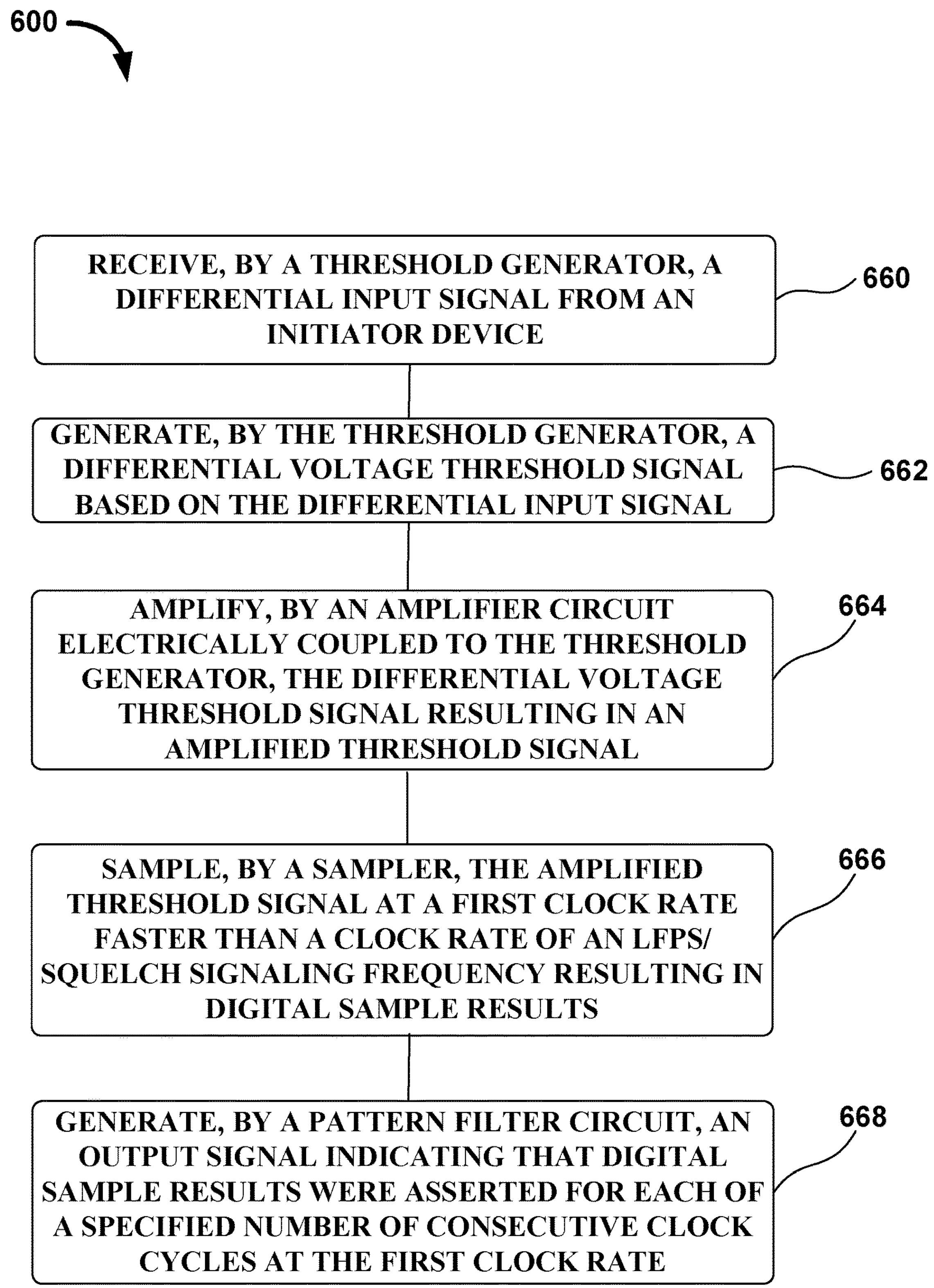

*FIG. 6*

DOUBLY-BALANCED AUTO-ZERO LFPS AND SQUELCH DETECTION

TECHNICAL FIELD

Embodiments pertain to low frequency periodic signaling (LFPS) or squelch signal detection.

BACKGROUND

For waking up from a low power state, such as in a universal serial bus 3 (USB3) of peripheral component interface express (PCI-e) interface, a side requesting a wakeup (the "initiator") starts transmitting a continuous low frequency periodic signaling (LFPS) signal, waits for the other side to acknowledge the wakeup request by transmitting an LFPS signal as well. When each side has detected an LFPS burst from the other side, it turns on its transceiver in a recovery state. Both sides reach recovery and move on to U0 just like after any transition to Recovery.

An LFPS circuit is used in universal serial bus 3 (USB3) input/output (I/O) circuit for low frequency in band signaling to bring a link partner out of a low power state or an error state. The LFPS circuit can also indicate its presence by an upstream port during a low power (e.g., U1) state. In PCI-E I/O a similar circuit is the squelch circuit that serves as the watch-dog to get the link in or come out of the power saving states. Both LFPS and Squelch circuits are used for low power circuit operations of high-speed I/O circuits.

Existing LPFS/squelch circuits usually suffer from false detection issues caused by an LFPS/squelch amplifier direct current (DC) offset effects and tight frequency separation between LFPS/squelch signal and normal high-speed signals. The DC offset effect can be minimized by applying certain offset calibration circuit techniques. However, the variation of the amplifier DC offset across the wide input common voltage makes the calibration unreliable.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

FIG. 6 illustrates, by way of example, a block diagram of an embodiment of a method for.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Embodiments provide a circuit that provides a solution to the LFPS/squelch amplifier false detection problem and other issues discussed in the Background. The proposed circuit is based on the following circuit blocks and features a) a built-in LFPS/squelch detection threshold to simplify the circuit implementation and to minimize detection threshold variations, b) a switched-capacitor amplifier with built-in auto-zero to eliminate the amplifier DC offset across power, voltage, and temperature (PVT) corners with extended common-mode range, c) a highly simplified digital amplifier for lower circuit power dissipation and improved design robustness, d) a doubly balanced detection structure to improve detection accuracy, e) a digital pattern filter to improve frequency detection accuracy between LFPS/Squelch and normal signal. Embodiments offer a simplified design with significantly improved detection accuracy at lower power dissipation and improved design robustness over prior solutions.

Other applications are possible and within the scope of embodiments.

Figure 1:
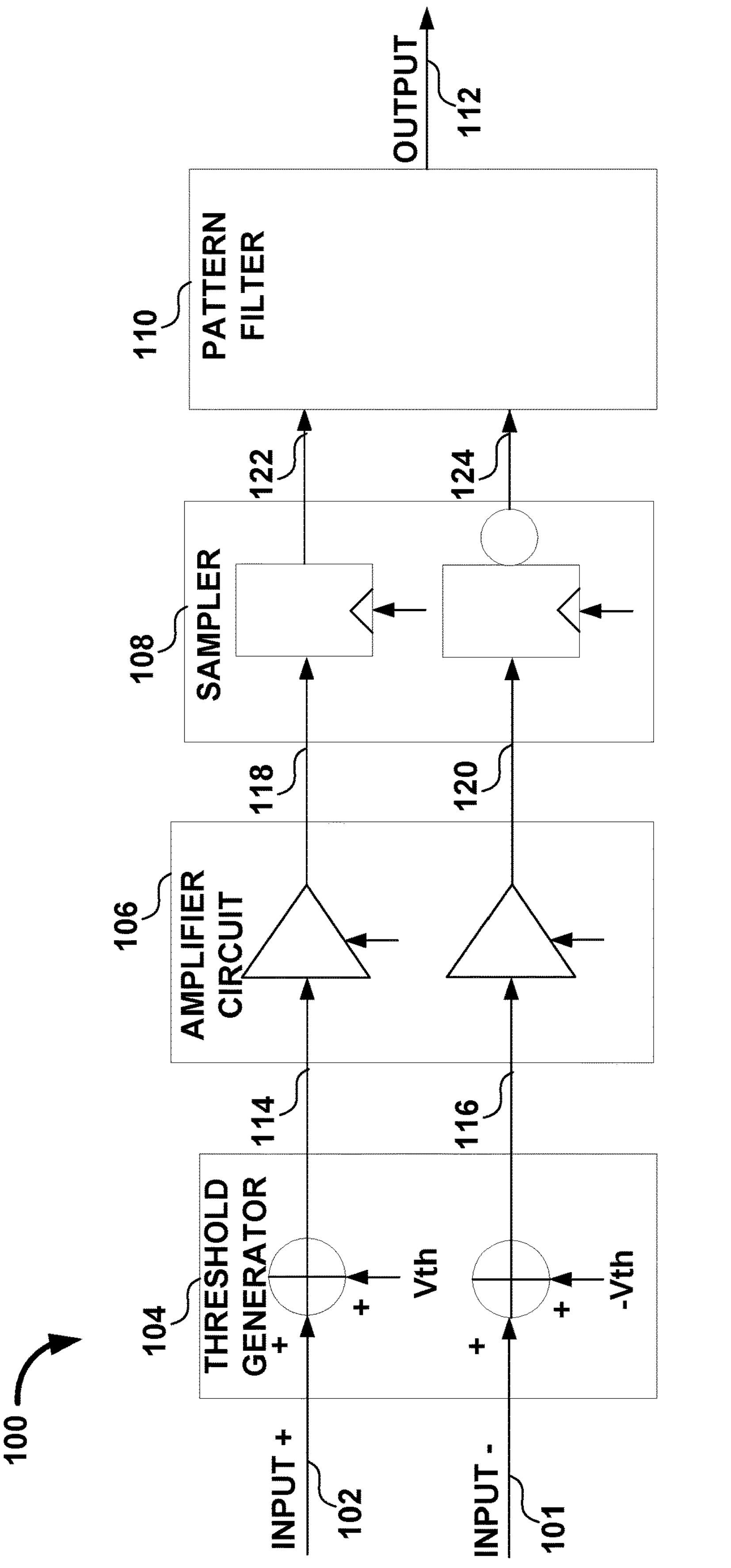
FIG. 1 illustrates, by way of example, a diagram of an embodiment of a circuit that can be used for LFPS or squelch signal detection.

FIG. 1 illustrates, by way of example, a diagram of an embodiment of a circuit 100 that can be used for LFPS or squelch detection. The circuit 100 is doubly balanced as the positive side of a differential input 102 and the negative side of the differential input 102 are individually balanced by capacitors (see the amplifier 106 illustrated in more detail in FIG. 2).

The circuit 100 includes a threshold generator 104 that receives the input 102 to generate a differential voltage that defines positive and negative threshold voltages used by the amplifier 106. The threshold generator 104 is illustrated in more detail in FIG. 2.

The circuit 100 includes the amplifier 106 that receives the threshold voltages 114, 116 from the voltage generator 104. The amplifier 106 amplifies the voltages form the voltage generator 104. The amplifier 106 is a switched-capacitor auto-zero amplifier that effectively eliminates PVT issues and device random variations. The amplifier 106 also effectively eliminates manufacturing variation issues and long-term variations (e.g., aging and electrical over-stress (EOS)) experienced by other amplifiers. The amplifier 106 offers simplified circuit implementation as compared to previous amplifiers in LFPS/squelch circuits. The amplifier 106 is shown in more detail in FIGS. 2 and 3.

The sampler circuit 108 provides snapshots of the output 118, 120 of the amplifier to a pattern filter 110. The snapshots can be taken at a frequency defined by an input clock. An example sampler circuit 108 is illustrated in more detail in FIGS. 2 and 4.

The pattern filter 110 receives output 122, 124 from the sampler circuit 108 to detect whether to assert or de-assert an output 112. The output 112 indicates whether the sampler circuit 108 has generated a specified number of consecutive sampled bits that are "1". More details regarding the pattern filter 110 are provided in FIG. 5.

Figure 2:
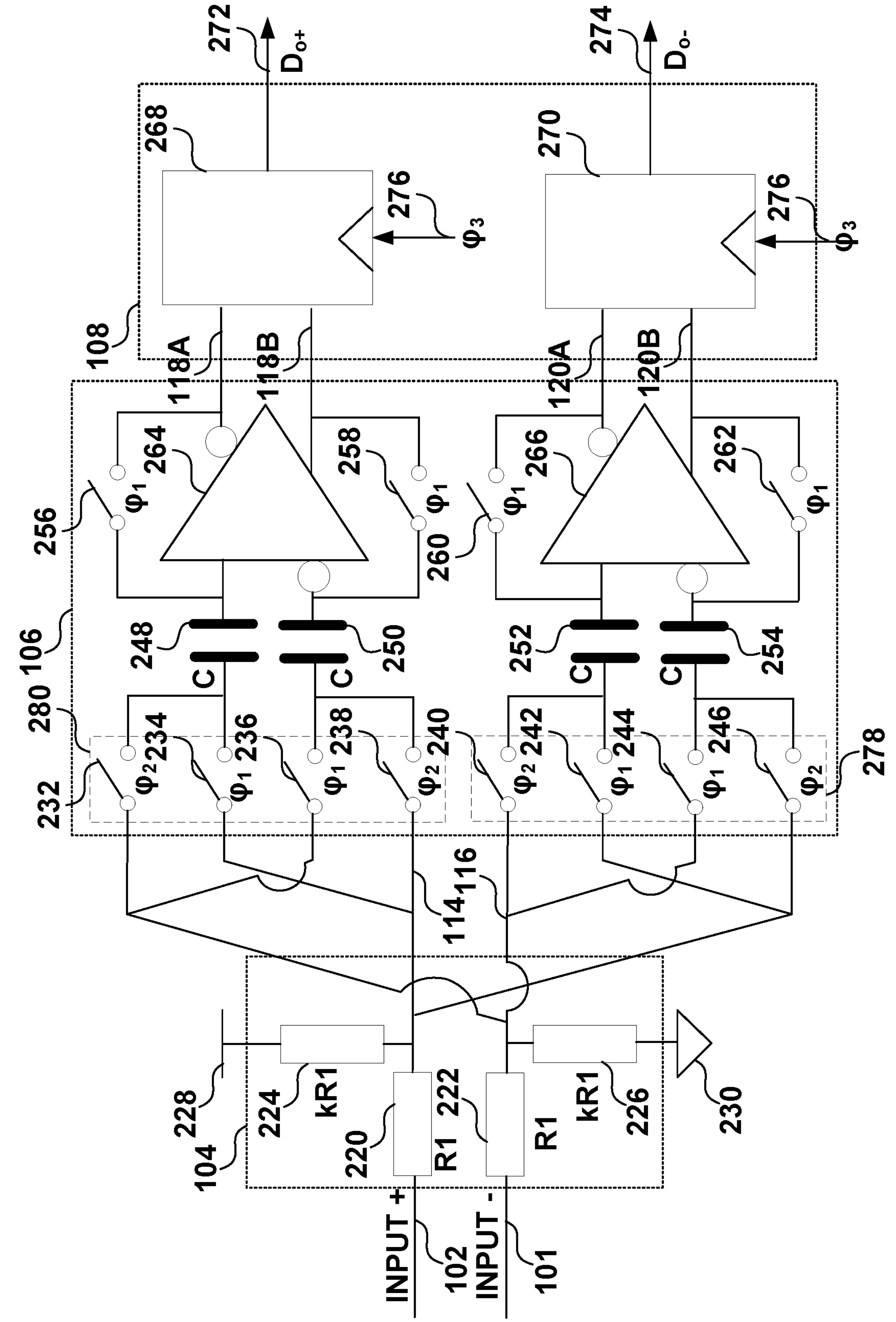
FIG. 2 illustrates, by way of example, a diagram of an embodiment of a portion of an LFPS/squelch circuit that includes the threshold generator, the amplifier, and the sampler of FIG. 1.

FIG. 2 illustrates, by way of example, a diagram of an embodiment of a portion of an LFPS/squelch circuit 200 that includes the threshold generator 104, the amplifier 106, and the sampler circuit 108. As in FIG. 1, the circuit 200 in FIG. 2 includes the threshold generator 104 that receives differential input 101, 102 and produces the differential threshold voltages 114, 116. The amplifier 106 receives the voltages 114, 116 from the threshold generator 104 and generates differential outputs 118A and 118B (positive and negative signals, respectively, of output 118) and 120A and 120B (positive and negative signals, respectively, of output 120). The sampler circuit 108 receives output 118 (comprised of differential outputs 118A and 118B) and 120 (comprised of outputs 120A and 120B) and produces digital samples 272, 274 that are input to the pattern filter 110.

The threshold generator 104 generates a threshold voltage as $V_{th}=V_{cc}*1/(1+k)$. $V_{th}$ is the difference (mathematical difference) between threshold voltage 114 and 116. k is a constant the defines a multiplicative difference between resistors 220 and 224 or 222 and 226. That is k is the ratio of the resistance of the resistor 224 to the resistance of the resistor 220 or the resistance of the resistor 226 to the resistance of the resistor 222. $V_{cc}$ is a voltage 228 that powers the circuit 100, 200. The resistor 226 is coupled to ground 230 to provide a negative limit for the threshold voltage 116 from the threshold generator 104.

Threshold voltages 114, 116 of the threshold generator 104 are provided to switch banks 278, 280 of the amplifier 106. The switch bank 280 includes switches 234, 236, 238, 240 electrically connected in parallel. The switch bank 278 includes switches 240, 242, 244, 246 electrically connected in parallel. The switches 232, 234 control a first input to a first amplifier 264. The switches 238, 240 control a second input to the first amplifier 264. A state (whether the switch is open or closed) of the switch 232 is controlled by a signal indicative of input voltage at input 102 ($\varphi_2$). A state of the switch 234 is controlled by a signal indicative of amplifier noise offset ($\varphi_1$). A state of the switch 236 is control by $\varphi_1$. A state of the switch 238 is controlled by $\varphi_2$. The capacitor 248 along with the switches 234, 236 are sometimes called a "switch capacitor". Similarly, the capacitor 250 along with the switches 238, 240 is also sometimes called a switch capacitor.

The switches 240, 242 control a first input to a second amplifier 266. The switches 244, 246 control a second input to the second amplifier 266. A state of the switch 240 is controlled by $\varphi_2$. A state of the switch 242 is controlled by $\varphi_1$. A state of the switch 244 is control by $\varphi_1$. A state of the switch 246 is controlled by $\varphi_2$. The capacitor 252 along with the switches 242, 244 are sometimes called a "switch capacitor". Similarly, the capacitor 254 along with the switches 244, 246 is also sometimes called a switch capacitor.

The amplifier 264 receives, as a first input, output from the capacitor 248 minus the output 118A. The amplifier 264 receives, as a second input, a negative version of the output of the capacitor 250 plus the output 118B. The amplifier 264 produces a differential output 118 that is provided to the sampler circuit 108. Feedback from the output 118A back to the first input of the amplifier 264 is controlled by a switch 256. A state of the switch 256 is controlled by $\varphi_1$. Feedback from the output 118B back to the second input of the amplifier 264 is controlled by a switch 258. A state of the switch 258 is controlled by $\varphi_1$.

The amplifier 266 receives, as a first input, output from the capacitor 252 minus the output 120A. The amplifier 266 receives, as a second input, a negative version of the output of the capacitor 254 plus the output 120B. The amplifier 266 produces a differential output 120 that is provided to the sampler circuit 108. Feedback from the output 120A back to the first input of the amplifier 264 is controlled by a switch 260. A state of the switch 260 is controlled by $\varphi_1$. Feedback from the output 120B back to the second input of the amplifier 266 is controlled by a switch 262. A state of the switch 262 is controlled by $\varphi_1$.

The sampler circuit 108 includes respective latches 268, 270 situated to receive output 118, 120 of the amplifiers 264, 266 respectively. The latches 268, 270 operate to store an input and provide digital samples 272, 274, respectively. The digital samples 272, 274 are provided at a time dictated by a rising edge of a clock signal 276. The clock signal 276 can operate at a higher frequency than a frequency of a LFPS/squelch signal.

Figure 3:
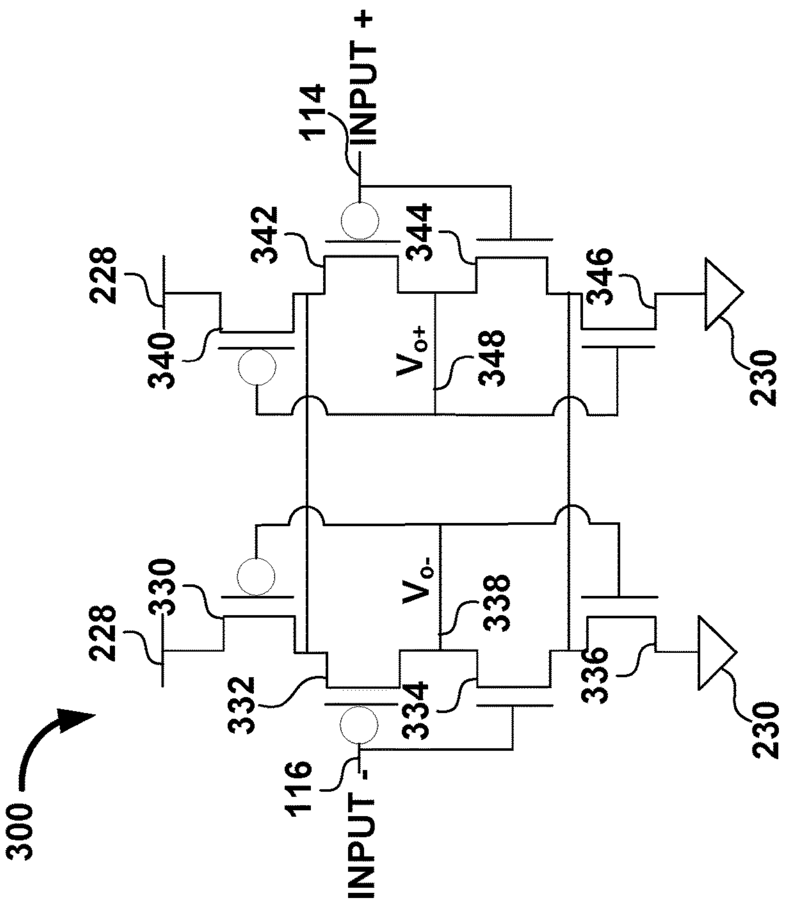
FIG. 3 illustrates, by way of example, a circuit diagram of an embodiment of an amplifier.

FIG. 3 illustrates, by way of example, a circuit diagram of an embodiment of an amplifier 300. The amplifier 264, 266 can be configured like the amplifier 300. The amplifier 300 includes symmetric circuits, one that operates using a positive end of the threshold voltages 114 and another that operates using a negative end of the threshold voltages 116. The voltage 228 is provided to a source of transistors 330, 340 electrically coupled in parallel.

A gate of the transistor 330 is controlled by a negated version of an amplifier output 338. The output 338 is the output 118B or 120B in FIG. 1 or FIG. 2. A transistor 332 is electrically coupled in series with the transistor 330. A source of the transistor 332 is electrically connected to a drain of the transistor 330. The drain of the transistor 330 is electrically connected to a source of a transistor 342. A gate of the transistor 332 is electrically controlled by a negated version of the threshold 116. A drain of the transistor 332 is the negative output 338 of the amplifier 300. A transistor 334 is electrically coupled in series with the transistor 332. The drain of the transistor 332 is electrically coupled to a source of the transistor 334. A gate of the transistor 334 is driven by the threshold voltage 116. A drain of the transistor 334 is electrically connected to a source of a transistor 336. The drain of the transistor 334 is electrically connected to a source of a transistor 346. A gate of the transistor 336 is driven by negative output 338 of the amplifier 300. A drain of the transistor 336 is electrically coupled to the ground 230.

A gate of the transistor 340 is controlled by a negated version of an amplifier output 348. The output 348 is the output 118A or 118B in FIG. 1 or FIG. 2. A transistor 342 is electrically coupled in series with the transistor 340. A source of the transistor 342 is electrically connected to a drain of the transistor 340. The drain of the transistor 340 is electrically connected to a source of the transistor 332. A gate of the transistor 342 is electrically controlled by a negated version of the threshold voltage 114. A drain of the transistor 342 is the negative output 348 of the amplifier 300. A transistor 344 is electrically coupled in series with the transistor 342. A drain of the transistor 342 is electrically connected to a source of the transistor 344. A gate of the transistor 344 is driven by the threshold voltage 114. A drain of the transistor 344 is electrically connected to a source of a transistor 346. The drain of the transistor 344 is electrically connected to a source of the transistor 336. A gate of the transistor 346 is driven by positive output 348 of the amplifier 300. A drain of the transistor 346 is electrically coupled to the ground 230.

Figure 4:
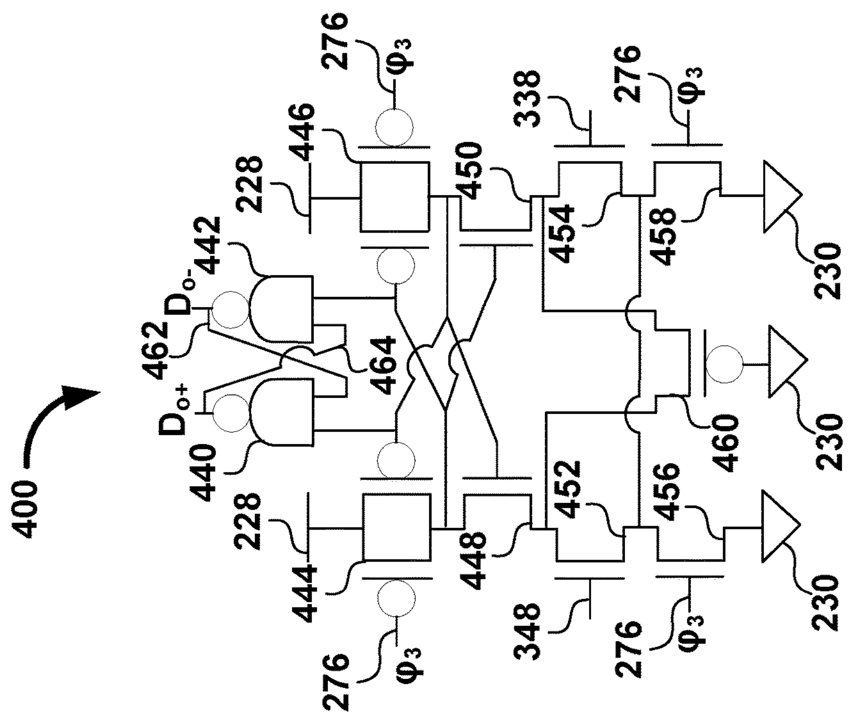
FIG. 4 illustrates, by way of example, a circuit diagram of an embodiment of a sampler circuit.

FIG. 4 illustrates, by way of example, a circuit diagram of an embodiment of a sampler circuit 400. The sampler circuit 108 can be implemented using the sampler circuit 400. The sampler circuit 400, like the amplifier 300, includes a symmetrical circuit. The sampler circuit 400 shown in FIG.

4 is sometimes called a Strong-Arm circuit. The sampler circuit 400 includes a first side that receives a positive output 348 of the amplifier 300 and a negative side, symmetric to the first side, that receives a negative output 338 of the amplifier 300. The sampler circuit 400 converts the analog output 338, 348 to a digital output 462, 464.

The first side includes a transistor 452 with a gate driven by the output 348. A source of the transistor 452 is electrically connected to a drain of a transistor 448 electrically connected in series to the transistor 452. The source of the transistor 452 is also electrically connected to a source of a balancing transistor 460. A drain of the transistor 452 is electrically connected to a source of a transistor 456 electrically connected in series with the transistor 452. The transistor 456 includes a gate driven by the $\varphi_3$ 276. A drain of the transistor 456 is electrically connected to ground 230. A gate of the transistor 448 is driven by output of a component 446. A source of the transistor 448 is electrically connected to an output of the component 444. The components 444 and 446 help pre-charge the sampler circuit 400. The components 444, 446 help eliminate a residual voltage and thus help improve the sample sensitivity. Before each sampling operation, what was historically stored in the sampler circuit 400 is erased by pulling drain nodes of 448 and 450 to Vcc using the components 444, 446. The components 444, 446 have an effect similar to the balancing transistor 460.

The second side includes a transistor 454 with a gate driven by the output 338. A source of the transistor 454 is electrically connected to a drain of a transistor 450 electrically connected in series to the transistor 454. The source of the transistor 454 is also electrically connected to a drain of the balancing transistor 460. A drain of the transistor 454 is electrically connected to a source of a transistor 458 electrically connected in series with the transistor 454. The transistor 458 includes a gate driven by the $\varphi_3$ 276. A drain of the transistor 458 is electrically connected to ground 230. A gate of the transistor 450 is driven by output of a component 444. A source of the transistor 450 is electrically connected to an output of the component 444.

The component 444 includes a negated $\varphi_3$ 276 and a negated output of the component 446 as inputs. The component 444 is driven by $V_{cc}$ 228. A latch formed from two NAND gates 440, 442 provides outputs 462 and 464 of the sampler circuit 400. The NAND gate 440 includes the output of the NAND gate 442 as a first input and an output of the component 446 as a second input. The NAND gate 442 includes the output of the NAND gate 440 as a first input and an output of the component 444 as a second input.

Figure 5:
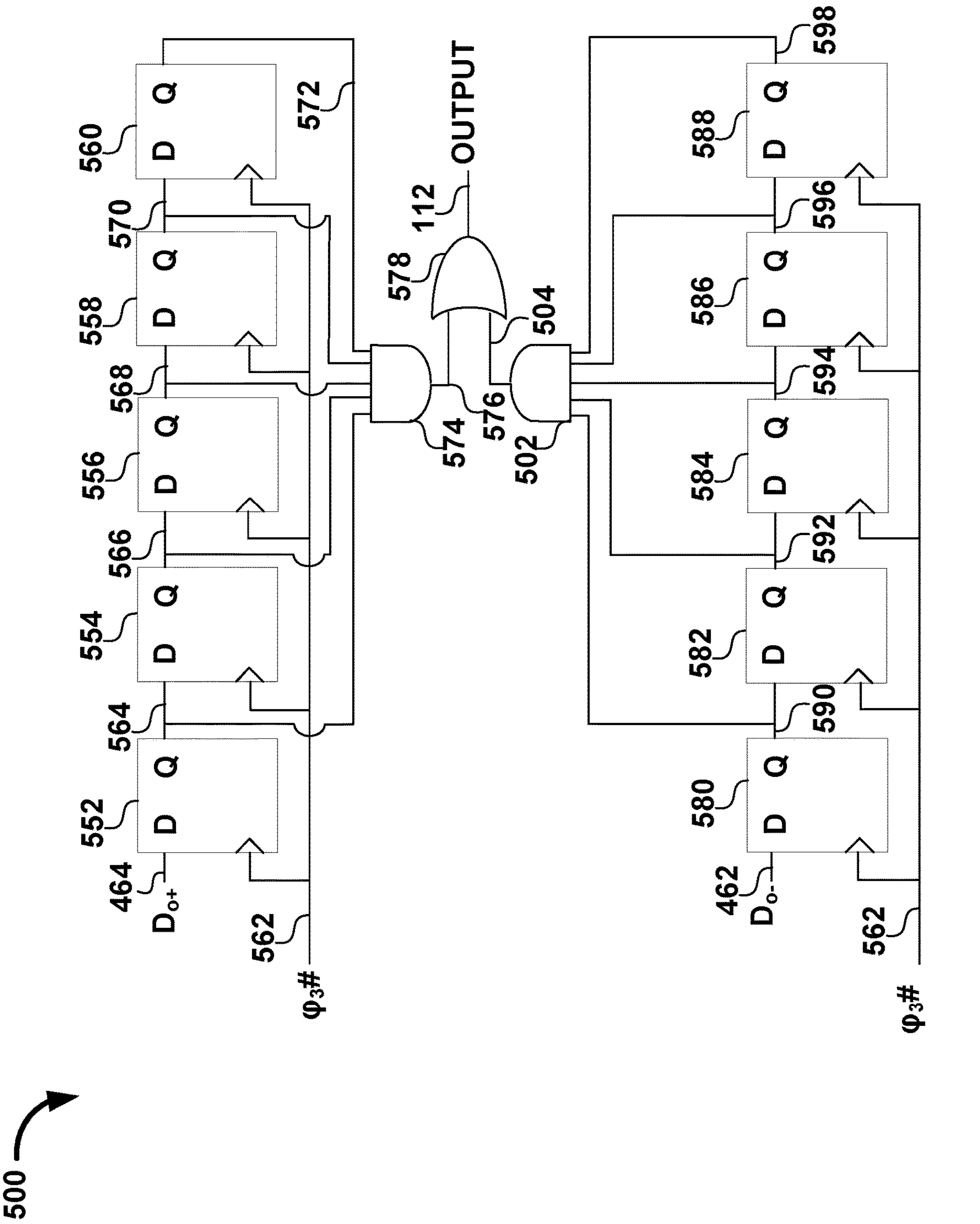
FIG. 5 illustrates, by way of example, a circuit diagram of an embodiment of a pattern filter.

FIG. 5 illustrates, by way of example, a circuit diagram of an embodiment of a pattern filter 500. The pattern filter 110 can be implemented using the pattern filter 500. The pattern filter 500 as illustrated includes two sets of series connected flip flops. A first series of flip flops includes flip flops 552, 554, 556, 558, 560. While the first series of flip flops includes five flip flops, more or fewer flip flops can be included in the first series of flip flops. A second series of flip flops includes flip flops 580, 582, 584, 586, 588. While the second series of flip flops includes five flip flops, more or fewer flip flops can be included in the second series of flip flops. Each of the flip flops 552, 554, 556, 558, 560, 580, 582, 584, 586, 588 is clocked by a negated version of the clock, $\varphi_3$ #562.

A first flip flop 552 of the first series of flip flops receives a positive output of the sampler circuit 400. Each successive flip flop 554, 556, 558, 560 in the first series of flip flops receives an output of the immediately prior flip flop in the series of flip flops. Thus, the flip flop 554 receives output 564 of the flip flop 552, the flip flop 556 receives output 566 of the flip flop 554, the flip flop 558 receives output 568 of the flip flop 556, the flip flop 560 receives output 570 of the flip flop 558. A first AND gate 574 receives outputs 564, 566, 568, 570, and 572 as inputs and produces a first AND output 576 based on the inputs.

A first flip flop 580 of the second series of flip flops receives a negative output of the sampler circuit 400. Each successive flip flop 582, 584, 586, 588 in the second series of flip flops receives an output of the immediately prior flip flop in the second series of flip flops. Thus, the flip flop 582 receives output 590 of the flip flop 580, the flip flop 584 receives output 592 of the flip flop 582, the flip flop 586 receives output 594 of the flip flop 584, the flip flop 588 receives output 596 of the flip flop 586. A second AND gate 502 receives outputs 590, 592, 594, 596, and 598 as inputs and produces a second AND output 504 based on the inputs.

Outputs 576 and 504 are provided to an OR gate 578 as inputs. The OR gate 578 provides the output 112. The output 112 is asserted if digital outputs 464, 462 are asserted or de-asserted for five consecutive clock cycles. This indicates that the device connected thereto is using a slower clock and can be in a low power mode per LFPS and squelch standards.

The pattern filter 500 differentiates between a lower magnitude LFPS/squelch signal and a higher magnitude data signal. For a small signal with magnitude lower than the detection threshold, both digital outputs 464 and 462 are low so the pattern filter 500 output 112 is low. For a higher frequency signal beyond the LFPS/squelch spec (e.g., 500+ MHz) the maximum running length of detected high is less than 5 clock cycles in either digital outputs 464 or 462, so the pattern filter output 112 will still be low. For a larger magnitude lower frequency signal (e.g., <about 50 MHz) the maximum running length is more than 5 clock cycles for either of the digital outputs 464, 462 are detected, the output 112 will be high to indicate a LFPS/squelch signal detection.

FIG. 6 illustrates, by way of example, a block diagram of an embodiment of a method 600 for LFPS/squelch detection. The method 600 as illustrated includes receiving, by a threshold generator, a differential input signal from an initiator device, at operation 660; generating, by the threshold generator, a differential voltage threshold signal based on the differential input signal, at operation 662; amplifying, by an amplifier circuit electrically coupled to the threshold generator, the differential voltage threshold signal resulting in an amplified threshold signal, at operation 664; sampling, by a sampler, the amplified threshold signal at a first clock rate faster than a clock rate of an LFPS/squelch signaling frequency resulting in digital sample results, at operation 666; and generating, by a pattern filter circuit, an output signal indicating that digital sample results were asserted for each of a specified number of consecutive clock cycles at the first clock rate, at operation 668.

The method 600 can further include, wherein the amplifier circuit includes a first amplifier. The method 600 can further include driving, by a first switched capacitor, a first input of the first amplifier. The method 600 can further include driving, by a second switched capacitor, a second input of the first amplifier. The method 600 can further include, wherein the amplifier circuit further includes a second amplifier. The method 600 can further include driving, by a third switched capacitor, a first input of the second amplifier. The method 600 can further include driving, by a fourth switched capacitor, a second input of the second amplifier.

The method 600 can further include receiving, by a first flip flop in a first series of flip flops electrically connected in series with each other, one end of a digital sample result of the digital sample results. The method 600 can further include receiving, by a first flip flop in a second series of flip flops electrically connected in series with each other, another end of the digital sample result. The method 600 can further include receiving, by a first logic gate coupled to the first series of flip flops, outputs of each flip flop of the first series of flip flops as input. The method 600 can further include receiving, by a second logic gate coupled to the second series of flip flops, outputs of each flip flop of the second series of flip flops as input. The method 600 can further include receiving, by a third logic gate, outputs of the first and second logic gates as inputs. The method 600 can further include producing, by the third logic gate, an output signal indicating whether the digital sample results were asserted for each of a specified number of consecutive clock cycles at the first clock rate.

Figure 7:
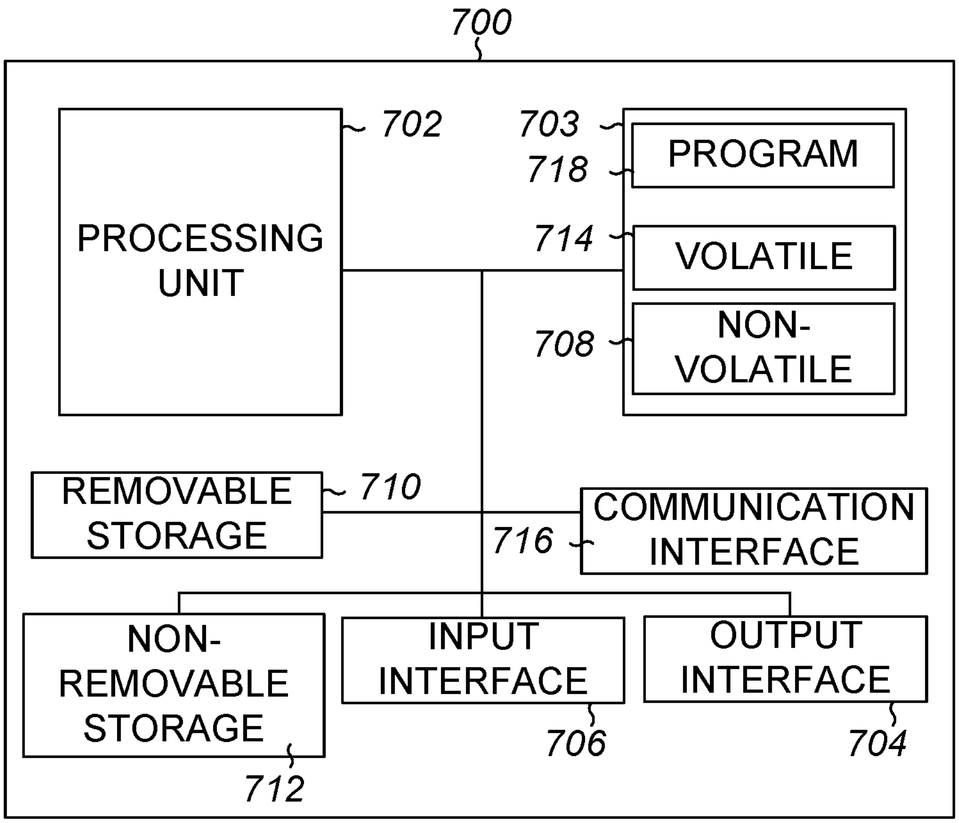
FIG. 7 illustrates, by way of example, a block diagram of an embodiment of a machine (e.g., a computer system) in which the LFPS/squelch circuitry of FIGS. 1-5, a combination thereof or another circuit or method discussed herein can be used.

FIG. 7 illustrates, by way of example, a block diagram of an embodiment of a machine 700 (e.g., a computer system) in which the LFPS/squelch circuitry of FIGS. 1-5, a combination thereof or another circuit or method discussed herein can be used. One example machine 700 (in the form of a computer), may include a processing unit 702, memory 703, removable storage 710, and non-removable storage 712. Although the example computing device is illustrated and described as machine 700, the computing device may be in different forms in different embodiments. Further, although the various data storage elements are illustrated as part of the machine 700, the storage may also or alternatively include cloud-based storage accessible via a network, such as the Internet.

Memory 703 may include volatile memory 714 and non-volatile memory 708. The machine 700 may include—or have access to a computing environment that includes—a variety of computer-readable media, such as volatile memory 714 and non-volatile memory 708, removable storage 710 and non-removable storage 712. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 700 may include or have access to a computing environment that includes input 706, output 704, and a communication connection 716. Output 704 may include a display device, such as a touchscreen, that also may serve as an input device. The input 706 may include one or more of a touchscreen, touchpad, mouse, keyboard, camera, one or more device-specific buttons, one or more sensors integrated within or coupled via wired or wireless data connections to the machine 700, and other input devices. The computer may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 802.11 (Wi-Fi), Bluetooth, or other networks.

Computer-readable instructions stored on a computer-readable storage device are executable by the processing unit 702 (sometimes called processing circuitry) of the machine 700. A hard drive, CD-ROM, and RAM are some examples of articles including a non-transitory computer-readable medium such as a storage device. For example, a computer program 718 may be used to cause processing unit 702 to perform one or more methods or algorithms described herein.

Note that the term "circuitry" or "circuit" as used herein refers to, is part of, or includes hardware components, such as transistors, resistors, capacitors, diodes, inductors, amplifiers, oscillators, switches, multiplexers, logic gates (e.g., AND, OR, XOR), power supplies, memories, or the like, such as can be configured in an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" or "circuit" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry", "processing circuitry", or "processor" as used herein thus refers to, is part of, or includes circuitry capable of sequentially and automatically carrying out a sequence of arithmetic or logical operations, or recording, storing, and/or transferring digital data. These terms may refer to one or more application processors, one or more baseband processors, a physical central processing unit (CPU), a single- or multi-core processor, and/or any other device capable of executing or otherwise operating computer-executable instructions, such as program code, software modules, and/or functional processes.

ADDITIONAL NOTES AND EXAMPLES

Example 1 includes a low frequency periodic signaling (LFPS)/squelch circuit comprising a threshold generator situated to receive a differential input signal from an initiator device and generate a differential voltage threshold signal based on the differential input signal, an amplifier circuit electrically coupled to the threshold generator situated to amplify the differential voltage threshold signal resulting in an amplified threshold signal, a sampler situated to sample the amplified threshold signal at a first clock rate faster than a clock rate of an LFPS/squelch signaling frequency resulting in digital sample results, and a pattern filter circuit situated to determine if the digital sample results are asserted for each of a specified number of consecutive clock cycles at the first clock rate.

In Example 2, Example 1 further includes a first amplifier, a first switched capacitor configured to drive a first input of the first amplifier, and a second switched capacitor configured to drive a second input of the first amplifier.

In Example 3, Example 2 further includes, wherein the amplifier circuit further includes a second amplifier, a third switched capacitor configured to drive a first input of the second amplifier, and a fourth switched capacitor configured to drive a second input of the second amplifier.

In Example 4, Example 3 further includes, wherein each of the first, second, third, and fourth switched capacitors include a first switch whose state is controlled by the threshold voltage and a second switch whose state is controlled by an offset voltage of the amplifier circuit.

In Example 5, at least one of Examples 3-4 further includes, wherein a first output of the first amplifier is fed back to the first input of the first amplifier and a second output of first amplifier is fed back to the second input of the first amplifier.

In Example 6, at least one of Examples 1-5 further includes a first series of flip flops electrically connected in series with each other, a first flip flop in the first series of flip flops situated to receive one end of a digital sample result of the digital sample results, and a second series of flip flops electrically connected in series with each other, a first flip flop in the second series of flip flops situated to receive another end of the digital sample result.

In Example 7, Example 6 further includes, wherein the pattern filter further includes a first logic gate coupled to receive outputs of each flip flop of the first series of flip flops as input, a second logic gate coupled to receive outputs of each flip flop of the second series of flip flops as input, and a third logic gate coupled to receive outputs of the first and second logic gates as inputs.

In Example 8, Example 7 further includes, wherein the first and second logic gates are AND gates and the third logic gate is an OR gate.

Example 9 includes a device comprising processing circuitry, and a low frequency periodic signaling (LFPS)/squelch circuit comprising a threshold generator situated to receive a differential input signal from an external device and generate a differential voltage threshold signal based on the differential input signal, an amplifier circuit electrically coupled to the threshold generator situated to amplify the differential voltage threshold signal resulting in an amplified threshold signal, a sampler situated to sample the amplified threshold signal at a first clock rate faster than a clock rate of an LFPS/squelch signaling frequency resulting in digital sample results, and a pattern filter circuit situated to determine if the digital sample results are asserted for each of a specified number of consecutive clock cycles at the first clock rate.

In Example 10, Example 9 further includes, wherein the amplifier circuit includes a first amplifier, a first switched capacitor configured to drive a first input of the first amplifier, and a second switched capacitor configured to drive a second input of the first amplifier.

In Example 11, Example 10 further includes, wherein the amplifier circuit further includes a second amplifier, a third switched capacitor configured to drive a first input of the second amplifier, and a fourth switched capacitor configured to drive a second input of the second amplifier.

In Example 12, at least one of Examples 10-11 further includes, wherein each of the first, second, third, and fourth switched capacitors include a first switch whose state is controlled by the threshold voltage and a second switch whose state is controlled by an offset voltage of the amplifier circuit.

In Example 13, at least one of Examples 10-12 further includes, wherein a first output of the first amplifier is fed back to the first input of the first amplifier and a second output of first amplifier is fed back to the second input of the first amplifier.

In Example 14, at least one of Examples 9-13 further includes, wherein the pattern filter includes a first series of flip flops electrically connected in series with each other, a first flip flop in the first series of flip flops situated to receive one end of a digital sample result of the digital sample results, and a second series of flip flops electrically connected in series with each other, a first flip flop in the second series of flip flops situated to receive another end of the digital sample result.

In Example 15, Example 14 further includes, wherein the pattern filter further includes a first logic gate coupled to receive outputs of each flip flop of the first series of flip flops as input, a second logic gate coupled to receive outputs of each flip flop of the second series of flip flops as input, and a third logic gate coupled to receive outputs of the first and second logic gates as inputs.

In Example 16, Example 15 further includes, wherein the first and second logic gates are AND gates and the third logic gate is an OR gate.

Example 17 includes a method for low frequency periodic signaling (LFPS)/squelch detection, the method comprising receiving, by a threshold generator, a differential input signal from an initiator device, generating, by the threshold generator, a differential voltage threshold signal based on the differential input signal, amplifying, by an amplifier circuit electrically coupled to the threshold generator, the differential voltage threshold signal resulting in an amplified threshold signal, sampling, by a sampler, the amplified threshold signal at a first clock rate faster than a clock rate of an LFPS/squelch signaling frequency resulting in digital sample results, and generating, by a pattern filter circuit, an output signal indicating that digital sample results were asserted for each of a specified number of consecutive clock cycles at the first clock rate.

In Example 18, Example 17 further includes, wherein the amplifier circuit includes a first amplifier and the method further comprises driving, by a first switched capacitor, a first input of the first amplifier, and driving, by a second switched capacitor, a second input of the first amplifier.

In Example 19, Example 18 further includes, wherein the amplifier circuit further includes a second amplifier and the method further comprises driving, by a third switched capacitor, a first input of the second amplifier, and driving, by a fourth switched capacitor, a second input of the second amplifier.

In Example 20, at least one of Examples 17-19 further includes receiving, by a first flip flop in a first series of flip flops electrically connected in series with each other, one end of a digital sample result of the digital sample results, receiving, by a first flip flop in a second series of flip flops electrically connected in series with each other, another end of the digital sample result, receiving, by a first logic gate coupled to the first series of flip flops, outputs of each flip flop of the first series of flip flops as input, receiving, by a second logic gate coupled to the second series of flip flops, outputs of each flip flop of the second series of flip flops as input, and receiving, by a third logic gate, outputs of the first and second logic gates as inputs, and producing, by the third logic gate, an output signal indicating whether the digital sample results were asserted for each of a specified number of consecutive clock cycles at the first clock rate.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A low frequency periodic signaling (LFPS)/squelch circuit comprising:

a threshold generator, including resistor divider circuits, situated to receive a differential input signal from an initiator device and generate a differential voltage threshold signal based on the differential input signal;

an amplifier circuit electrically coupled to the threshold generator situated to amplify the differential voltage threshold signal resulting in an amplified threshold signal;

a sampler situated to sample the amplified threshold signal at a first clock rate faster than a clock rate of an LFPS/squelch signaling frequency resulting in digital sample results; and a pattern filter circuit situated to determine if the digital sample results are asserted for each of a specified number of consecutive clock cycles at the first clock rate.

2. The circuit of claim 1, wherein the amplifier circuit includes:

a first amplifier;

a first switched capacitor configured to drive a first input of the first amplifier; and a second switched capacitor configured to drive a second input of the first amplifier.

3. The circuit of claim 2, wherein the amplifier circuit further includes:

a second amplifier;

a third switched capacitor configured to drive a first input of the second amplifier; and a fourth switched capacitor configured to drive a second input of the second amplifier.

4. The circuit of claim 3, wherein each of the first, second, third, and fourth switched capacitors include a first switch whose state is controlled by the threshold voltage and a second switch whose state is controlled by an offset voltage of the amplifier circuit.

5. The circuit of claim 3, wherein a first output of the first amplifier is fed back to the first input of the first amplifier and a second output of first amplifier is fed back to the second input of the first amplifier.

6. The circuit of claim 1, wherein the pattern filter includes:

a first series of flip flops electrically connected in series with each other, a first flip flop in the first series of flip flops situated to receive one end of a digital sample result of the digital sample results; and a second series of flip flops electrically connected in series with each other, a first flip flop in the second series of flip flops situated to receive another end of the digital sample result.

7. The circuit of claim 6, wherein the pattern filter further includes:

a first logic gate coupled to receive outputs of each flip flop of the first series of flip flops as input;

a second logic gate coupled to receive outputs of each flip flop of the second series of flip flops as input; and a third logic gate coupled to receive outputs of the first and second logic gates as inputs.

8. The circuit of claim 7, wherein the first and second logic gates are AND gates and the third logic gate is an OR gate.

9. A device comprising:

processing circuitry;

a low frequency periodic signaling (LFPS)/squelch circuit comprising:

a threshold generator situated to receive a differential input signal from an external device and generate a differential voltage threshold signal based on the differential input signal;

an amplifier circuit, including a switch capacitor amplifier circuit, electrically coupled to the threshold generator situated to amplify the differential voltage threshold signal resulting in an amplified threshold signal;

a sampler situated to sample the amplified threshold signal at a first clock rate faster than a clock rate of an LFPS/squelch signaling frequency resulting in digital sample results; and a pattern filter circuit situated to determine if the digital sample results are asserted for each of a specified number of consecutive clock cycles at the first clock rate.

10. The device of claim 9, wherein the amplifier circuit includes:

a first amplifier;

a first switched capacitor configured to drive a first input of the first amplifier; and a second switched capacitor configured to drive a second input of the first amplifier.

11. The device of claim 10, wherein the amplifier circuit further includes:

a second amplifier;

a third switched capacitor configured to drive a first input of the second amplifier; and a fourth switched capacitor configured to drive a second input of the second amplifier.

12. The device of claim 11, wherein each of the first, second, third, and fourth switched capacitors include a first switch whose state is controlled by the threshold voltage and a second switch whose state is controlled by an offset voltage of the amplifier circuit.

13. The device of claim 10, wherein a first output of the first amplifier is fed back to the first input of the first amplifier and a second output of first amplifier is fed back to the second input of the first amplifier.

14. The device of claim 9, wherein the pattern filter includes:

a first series of flip flops electrically connected in series with each other, a first flip flop in the first series of flip flops situated to receive one end of a digital sample result of the digital sample results; and a second series of flip flops electrically connected in series with each other, a first flip flop in the second series of flip flops situated to receive another end of the digital sample result.

15. The device of claim 14, wherein the pattern filter further includes:

a first logic gate coupled to receive outputs of each flip flop of the first series of flip flops as input;

a second logic gate coupled to receive outputs of each flip flop of the second series of flip flops as input; and a third logic gate coupled to receive outputs of the first and second logic gates as inputs.

16. The device of claim 15, wherein the first and second logic gates are AND gates and the third logic gate is an OR gate.

17. A method for low frequency periodic signaling (LFPS)/squelch detection, the method comprising:

receiving, by a threshold generator, a differential input signal from an initiator device;

generating, by the threshold generator, a differential voltage threshold signal based on the differential input signal;

amplifying, by an amplifier circuit, which includes a switch capacitor amplifier circuit, electrically coupled to the threshold generator, the differential voltage threshold signal resulting in an amplified threshold signal;

sampling, by a sampler, the amplified threshold signal at a first clock rate faster than a clock rate of an LFPS/squelch signaling frequency resulting in digital sample results; and generating, by a pattern filter circuit, an output signal indicating that digital sample results were asserted for each of a specified number of consecutive clock cycles at the first clock rate.

18. The method of claim 17, wherein the amplifier circuit includes a first amplifier and the method further comprises:

driving, by a first switched capacitor, a first input of the first amplifier; and driving, by a second switched capacitor, a second input of the first amplifier.

19. The method of claim 18, wherein the amplifier circuit further includes a second amplifier and the method further comprises;

driving, by a third switched capacitor, a first input of the second amplifier; and driving, by a fourth switched capacitor, a second input of the second amplifier.

20. The method of claim 17, further comprises:

receiving, by a first flip flop in a first series of flip flops electrically connected in series with each other, one end of a digital sample result of the digital sample results;

receiving, by a first flip flop in a second series of flip flops electrically connected in series with each other, another end of the digital sample result;

receiving, by a first logic gate coupled to the first series of flip flops, outputs of each flip flop of the first series of flip flops as input;

receiving, by a second logic gate coupled to the second series of flip flops, outputs of each flip flop of the second series of flip flops as input;

receiving, by a third logic gate, outputs of the first and second logic gates as inputs; and producing, by the third logic gate, an output signal indicating whether the digital sample results were asserted for each of a specified number of consecutive clock cycles at the first clock rate.

* * * * *